United States Patent
Ohashi et al.

(10) Patent No.: US 8,533,942 B2
(45) Date of Patent: Sep. 17, 2013

(54) PRODUCTION METHOD OF MULTILAYER PRINTED WIRING BOARD AND MULTILAYER PRINTED WIRING BOARD

(75) Inventors: Seiichiro Ohashi, Kawasaki (JP); Eiichi Hayashi, Kawasaki (JP); Shigeo Nakamura, Kawasaki (JP); Takaaki Yazawa, Nagano (JP); Junichi Nakamura, Nagano (JP)

(73) Assignees: Ajinomoto Co., Inc., Tokyo (JP); Shinko Electric Industries Co., Ltd., Nagano-shi (JP)

( * ) Notice: Subject to any disclaimer, the term of this patent is extended or adjusted under 35 U.S.C. 154(b) by 614 days.

(21) Appl. No.: 12/275,481

(22) Filed: Nov. 21, 2008

(65) Prior Publication Data

US 2009/0133910 A1 May 28, 2009

(30) Foreign Application Priority Data

Nov. 22, 2007 (JP) .................................. 2007-303737

(51) Int. Cl.
- *H05K 3/02* (2006.01)
- *H05K 3/10* (2006.01)
- *H01K 3/10* (2006.01)

(52) U.S. Cl.
USPC ............................................. 29/846; 29/852

(58) Field of Classification Search
USPC .................. 29/846, 852, 829, 830; 174/255, 174/259, 264, 266
See application file for complete search history.

(56) References Cited

U.S. PATENT DOCUMENTS

| | | | | |
|---|---|---|---|---|
| 5,017,742 A * | 5/1991 | Bladon | .......................... | 174/266 |
| 5,352,325 A * | 10/1994 | Kato | ................................ | 216/18 |
| 5,527,741 A * | 6/1996 | Cole et al. | ..................... | 438/107 |
| 5,906,042 A * | 5/1999 | Lan et al. | ......................... | 29/852 |
| 6,054,761 A * | 4/2000 | McCormack et al. | ......... | 257/698 |
| 6,127,633 A * | 10/2000 | Kinoshita | ..................... | 174/259 |
| 7,690,110 B2 * | 4/2010 | Whittaker et al. | ............... | 29/852 |
| 7,748,115 B2 * | 7/2010 | Vasudivan et al. | .............. | 29/852 |
| 7,827,680 B2 * | 11/2010 | En et al. | ......................... | 29/831 |

(Continued)

FOREIGN PATENT DOCUMENTS

| JP | 9-116265 | 5/1997 |
|---|---|---|
| JP | 2000-319386 | 11/2000 |

(Continued)

OTHER PUBLICATIONS

Office Action issued Dec. 18, 2012 in Japanese Patent Application No. 2008-297870 (with English-language translation).

(Continued)

*Primary Examiner* — David Angwin

(74) *Attorney, Agent, or Firm* — Oblon, Spivak, McClelland, Maier & Neustadt, L.L.P.

(57) ABSTRACT

Multilayer printed wiring boards may be prepared by forming a via hole by laser irradiation in insulating layer formed by a prepreg, comprised of a glass cloth impregnated with a thermosetting resin composition, and subjecting the via hole to a glass etching treatment with a glass etching solution and then to a desmear treatment with an oxidizing agent solution. By such a process, etch back phenomenon and excessive protrusion of glass cloth from the wall surface of a via hole can be sufficiently suppressed, and a highly reliable via can be formed. Particularly, a highly reliable via can be formed in a small via hole having a top diameter of 75 μm or below.

9 Claims, 5 Drawing Sheets

(56) References Cited

U.S. PATENT DOCUMENTS

| | | | |
|---|---|---|---|
| 7,849,593 B2 * | 12/2010 | Kawamura et al. | 29/846 |
| 7,918,021 B2 * | 4/2011 | Kogure et al. | 29/852 |
| 2002/0102745 A1 * | 8/2002 | Lahiri et al. | 438/4 |
| 2004/0112634 A1 * | 6/2004 | Tanaka et al. | 174/262 |
| 2007/0295607 A1 | 12/2007 | Kawai | |
| 2008/0004367 A1 * | 1/2008 | Takada et al. | 522/107 |

FOREIGN PATENT DOCUMENTS

| | | |
|---|---|---|
| JP | 2002-12667 | 1/2002 |
| JP | 2002-100866 | 4/2002 |
| JP | 2002-314254 | 10/2002 |
| JP | 2003-124632 | 4/2003 |
| JP | 2004-288795 | 10/2004 |
| JP | 2005-086164 * | 3/2005 |
| JP | 2005-86164 | 3/2005 |
| JP | 2006-37083 | 2/2006 |
| JP | 2007-254710 | 10/2007 |
| JP | 2009-246357 | 10/2009 |
| WO | WO 2006/059750 A1 | 6/2006 |

OTHER PUBLICATIONS

Office Action issued Mar. 12, 2012, in Chinese Application No. 200810181503.8 (with English Translation).

Office Action issued in Chinese Application No. 200810181503.8 on Aug. 28. 2012 with English Translation.

Office Action issued Jul. 23, 2013, in Japanese Application No. 297870/2008 (with English-language Translation).

* cited by examiner (a)

(b)

(c)

(a)

(b)

PRODUCTION METHOD OF MULTILAYER PRINTED WIRING BOARD AND MULTILAYER PRINTED WIRING BOARD

CROSS REFERENCES TO RELATED APPLICATIONS

This application claims priority to Japanese Patent Application No. No. 2007-303737, filed on Nov. 22, 2007, which is incorporated herein by reference in its entirety.

BACKGROUND OF THE INVENTION

1. Field of the Invention

The present invention relates to processes for making a multilayer printed wiring board. The present invention also relates to multilayer printed wiring boards produced by such a process.

2. Discussion of the Background

As a technique for producing a multilayer printed wiring board, a production method using a build-up process of alternately layering an insulating layer and a conductive layer on a core substrate is conventionally known. For formation of an insulating layer, an adhesive film is exclusively used, which is formed by forming a thermosetting resin layer on a plastic film, where an insulating layer is formed by laminating the adhesive film on an internal-layer circuit substrate, detaching the plastic film and thermally curing the thermosetting resin. On the other hand, in view of the recent demand for downsizing of electronic device and electronic parts, for example, multilayer printed wiring boards tend to be made thinner, since a thinner core substrate and omission of a substrate are desired and the like. In such attempt to provide a thinner multilayer printed wiring board by producing a thinner core substrate, omitting a substrate and the like, the use of a prepreg as a material to form an interlayer insulating layer is effective for maintaining the mechanical strength of the multilayer printed wiring board.

FIGS. 4(a)-(e) and FIGS. 5(a) and (b) are sectional views of steps showing production steps of a multilayer printed wiring board comprising an interlayer insulating layer formed using a prepreg comprised of a sheet-like glass cloth fiber substrate impregnated with a thermosetting resin.

First, a circuit substrate 10 and a prepreg 3 comprised of a glass cloth 1 impregnated with a thermosetting resin composition 2 are prepared (FIGS. 4(a) and 4(b)), the prepreg 3 is laminated on a circuit substrate 10 to cover a conductor pattern (pad) 11 on the surface of the circuit substrate 10, and the thermosetting resin composition 2 is cured to form an insulating layer 4 (FIG. 4(c)). Then, as shown in FIG. 4(d), a via hole (blind via) 5 is formed by laser irradiation on the insulating layer 4. Due to the difference in the processability between the glass cloth 1 and the insulating layer 4 (cured product of thermosetting resin composition 2), the glass cloth 1 protrudes from the wall surface of the via hole 5 (see, FIG. 4(d)). When, after the laser processing, a desmear treatment to remove the residue produced by the laser processing is applied, the glass cloth 1 further protrudes from the wall surface of via hole 5 (see, FIG. 4(e)). However, when the glass cloth 1 protruding from the wall surface of the via hole is left as it is, the glass cloth may impede the flow (flowability) of a plating solution in the next plating process, thereby producing an uneven plating in the via hole. As a result, formation of a via with high conduction reliability becomes difficult. To prevent this, the glass cloth protruding from the sidewall surface of the via hole needs to be treated and, for example, JP-A-2002-100866 suggests an etching treatment with fluoride and the like. Moreover, JP-A-2005-86164 points out a problem that, when the method described in the above-mentioned JP-A-2002-100866 is applied to the actual production of a multilayer circuit substrate, a matrix resin melted by laser irradiation attaches to a glass cloth and prevents contact of fluoride with the glass cloth, whereby the glass cloth cannot be effectively removed by etching. To solve the problem, the resin residue is removed using an alkaline potassium permanganate solution after formation of a via hole, and the glass cloth is then subjected to an etching treatment. After the etching treatment of the glass cloth, the glass cloth 1 does not protrude from the wall surface of the via hole 5 (see, FIG. 5(a)). In this state, a via 20 is generally formed in the via hole 5 by plating and the like (see, FIG. 5(b)), whereby the interlayer conduction is achieved.

SUMMARY OF THE INVENTION

In recent years, the via hole diameter also tends to be downsized for ultrafine wiring on multilayer printed wiring boards. When a glass cloth protruding from the sidewall surface of a via hole having a small diameter is sufficiently etched, as shown in FIG. 5(a), a clearance S having an opening on the wall surface of the via hole 5 is formed in the insulating layer 4 due to the advanced surface dissolution of the glass cloth 1. As a result, a plating solution penetrates into the clearance S during a plating treatment for forming the via, thus forming a conductive film (plating film) 21 in the clearance S (see, FIG. 5(b)), which is so-called an etch back phenomenon of a glass cloth. This is a phenomenon common to vias formed on insulating layers, which causes inconvenience such as decreased insulation reliability between via 20 and an adjacent via and the like.

JP-A-2005-86164 points out a problem of the wicking phenomenon (etch back phenomenon) in a through hole. However, it is completely silent on the etch back phenomenon of a via hole. This is because, it is assumed, JP-A-2005-86164 relates to a via hole having a comparatively large diameter of 100 μm (top diameter) as a target, where the problem of deteriorated flow of a plating solution (problem of difficult flow of a plating solution) does not manifest itself, and etching of a glass cloth to a level causing the etch back phenomenon is not necessary. However, according to the investigation by the present inventors, it has been found that the problem of a deteriorated flow of a plating solution becomes significant for a via hole with a smaller diameter, for example, a via hole with a small top diameter of not more than 75 μm, and a glass cloth protruding from a via hole wall surface needs to be etched sufficiently, thus causing the etch back phenomenon in such via holes. In other words, the present inventors have found that sufficient etching of a glass cloth results in etching of the glass cloth inside the wall of a via hole, causing the etch back phenomenon, and etching under the conditions leaving the glass cloth intact inside the wall of a via hole fails to sufficiently etch the glass cloth protruding from the wall surface, thus causing deteriorated flow of a plating solution (low flowability).

Accordingly, it is one object of the present invention to provide novel processes for making a multilayer printed wiring board.

It is another object of the present invention to provide novel processes for making a multilayer printed wiring board which can sufficiently suppress the etch back phenomenon and protrusion of a glass cloth from the wall surface of a via hole, and can form a highly reliable via.

It is another object of the present invention to provided novel multilayer printed wiring boards produced by such a process.

It is another object of the present invention to provided novel multilayer printed wiring board having a highly reliable via.

These and other objects, which will become apparent during the following detailed description, have been achieved by the inventors' discovery that, by forming, by laser irradiation, a via hole in an insulating layer formed by thermally curing a prepreg comprised of a glass cloth impregnated with a thermosetting resin composition, etching the glass cloth protruding from the sidewall surface of the via hole, and applying a desmear treatment with an oxidizing agent solution to the via hole, a clearance having an opening on the sidewall surface of a via hole, which is formed due to the advanced surface dissolution of the glass cloth during etching thereof, can be eliminated because the oxidizing agent solution etches the resin cured product during the desmear treatment.

Accordingly, the present invention provides the following:

(1) A process for making a multilayer printed wiring board, comprising:

forming, by laser irradiation, a via hole in an insulating layer formed by a prepreg comprised of a glass cloth impregnated with a thermosetting resin composition;

subjecting the via hole to a glass etching treatment with a glass etching solution; and then subjecting the via hole to a desmear treatment with an oxidizing agent solution.

(2) The process of the above-mentioned (1), wherein the via hole has a top diameter of not more than 75 μm.

(3) The process of the above-mentioned (1) or (2), wherein the insulating layer is formed by laminating the prepreg on at least one surface of the circuit substrate, heating and pressing the laminate under reduced pressure, and thermally curing the prepreg.

(4) The process of any of the above-mentioned (1) to (3), wherein the oxidizing agent solution is an alkaline permanganate solution.

(5) The process of any of the above-mentioned (1) to (4), wherein the desmear treatment of the via hole with the oxidizing agent solution is performed simultaneously with a roughening treatment of the insulating layer surface with the oxidizing agent solution.

(6) The process of the above-mentioned (5), further comprising a plating process for forming a conductive layer on a roughened surface of the insulating layer by plating.

(7) The process of the above-mentioned (6), further comprising an annealing treatment step for annealing the insulating layer and the conductive layer after forming the conductive layer.

(8) The process of the above-mentioned (7), further comprising a circuit formation step for forming a circuit on the conductive layer.

(9) A multilayer printed wiring board comprising an insulating layer formed by a prepreg comprised of a glass cloth impregnated with a thermosetting resin composition, a via hole formed in the insulating layer, a circuit containing a via formed by conductive layer in the via hole, and a glass cloth protruding in a length of not more than 6 μm from the sidewall of the aforementioned via hole, wherein the protruding part of the glass cloth is embedded in the conductive layer forming the via.

(10) The multilayer printed wiring board of the above-mentioned (9), wherein the insulating layer is formed by a build-up method.

(11) The multilayer printed wiring board of the above-mentioned (9) or (10), wherein the surface of the insulating layer is roughened to have an arithmetic mean roughness (Ra) within the range of 0.1-1.5 μm.

(12) A multilayer printed wiring board, which is prepared by the process of the above-mentioned (1).

According to the process of making a multilayer printed wiring board of the present invention, since a desmear treatment with an oxidizing agent solution is applied to a via hole formed on the insulating layer, after the etching treatment of a glass cloth protruding from the sidewall surface of the via hole, a clearance having an opening on the sidewall surface of a via hole (clearance due to dissolution of glass cloth), which is possibly formed during the etching treatment of the glass cloth can be eliminated because the oxidizing agent solution etches the resin cured product constituting the insulating layer during the desmear treatment. Accordingly, both etching that sufficiently reduces the length of the protrusion of a glass cloth from the sidewall surface of the via hole and suppression of the etch back phenomenon can be simultaneously achieved, and a highly reliable via free of inconveniences due to a degraded flow of a plating solution (reduced flowability) or etch back phenomenon can be formed. Therefore, the present invention can afford, for example, a highly reliable multilayer printed wiring board having a small diameter via having a top diameter of not more than 75 μm.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

Figure 1:
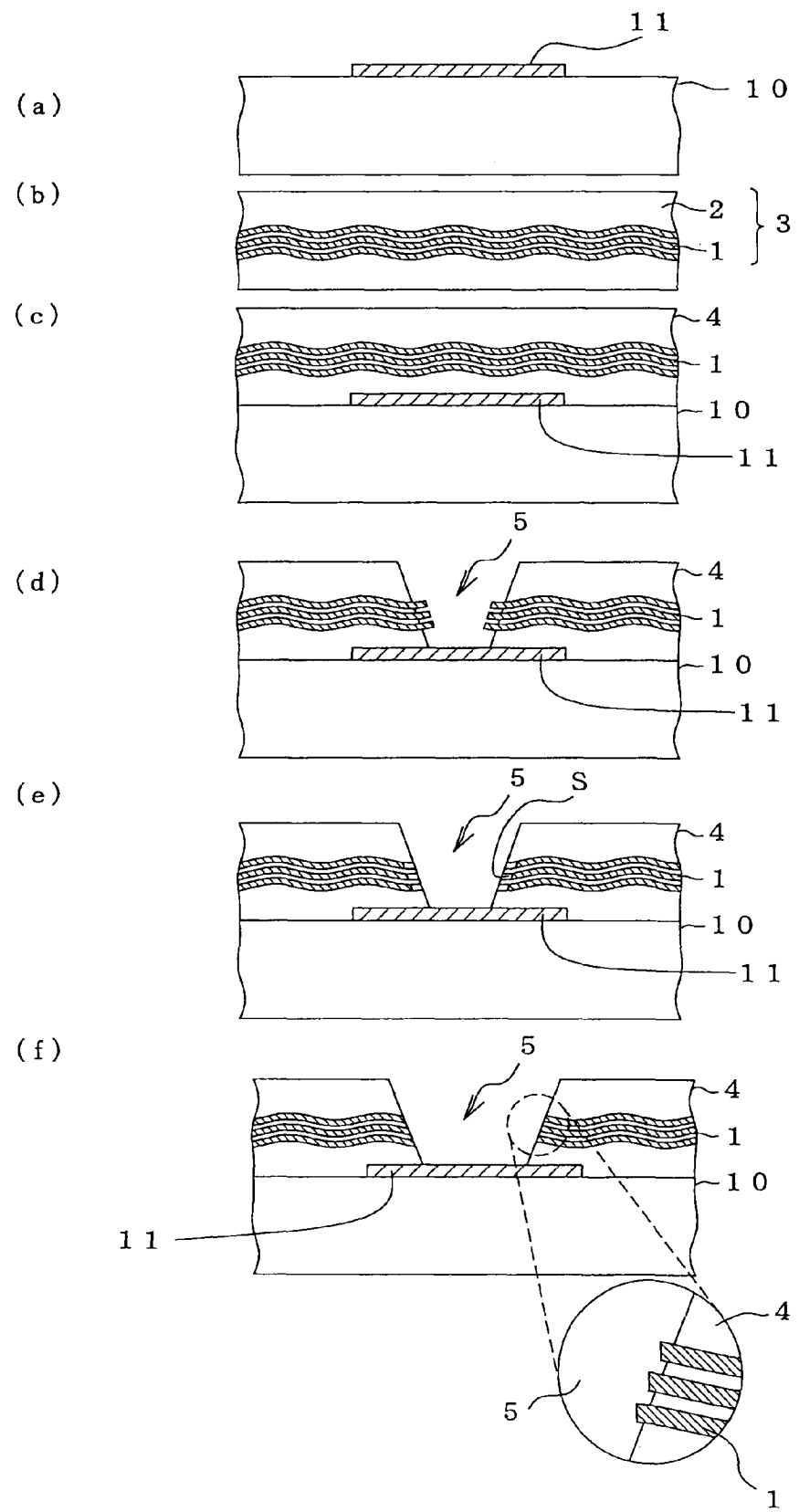
FIG. 1(a) to FIG. 1(f) are sectional views of the steps of one embodiment of the production method of the multilayer printed wiring board of the present invention.

In the Figures, 1 shows a glass cloth, 2 shows a thermosetting resin composition, 3 shows a prepreg, 4 shows an insulating layer, 5 shows a via hole, 9 shows a via (filled via), and 10 shows a circuit substrate.

DETAILED DESCRIPTION OF THE PREFERRED EMBODIMENTS

The prepreg in the present invention is comprised of a glass cloth as a sheet-like fiber substrate, which is impregnated with a thermosetting resin composition. As the glass cloth, known glass cloths used for prepregs can be used without limitation, which may be a woven fabric or a non-woven fabric. Preferred is a woven fabric, since thin woven fabrics having high strength are commercially available and easily obtained. In addition, while the thickness of the glass cloth is not particularly limited, it is preferably not more than 50 μm, particularly preferably 10 to 30 μm. Specific examples of the glass cloth in the form of a woven fabric include "STYLE 1027MS" manufactured by Asahi-Schwebel Co., Ltd. (warp yarn density 75 yarns/25 mm, weft yarn density 75 yarns/25 mm, cloth weight 20 g/m$^2$, thickness 19 μm), "STYLE 1037MS" manufactured by Asahi-Schwebel Co., Ltd. (warp yarn density 70 yarns/25 mm, weft yarn density 73 yarns/25 mm, cloth weight 24 g/m$^2$, thickness 28 μm), "1037NS" manufactured by Arisawa Mfg. Co., Ltd. (warp yarn density 72 yarns/25 mm, weft yarn density 69 yarns/25 mm, cloth weight 23 g/m$^2$, thickness 21 μm), "1027NS" manufactured by Arisawa Mfg. Co., Ltd. (warp yarn density 75 yarns/25 mm, weft yarn density 75 yarns/25 mm, cloth weight 19.5 g/m$^2$, thickness 16 μm), "1015NS" manufactured by Arisawa Mfg. Co., Ltd. (warp yarn density 95 yarns/25 mm, weft yarn density 95 yarns/25 mm, cloth weight 17.5 g/m$^2$, thickness 15 μm) and the like. In addition, specific examples of the glass cloth in the form of a non-woven fabric include "Cumulass EPM4025" manufactured by Japan Vilene Company, Ltd. (diameter about 13 μm, fiber length about 10 μm), "Cumulass EPM4100B" (diameter about 13 μm, fiber length about 10 μm) and the like.

As the thermosetting resin composition, any can be used without any particular limitation as long as it is suitable for the insulating layer of a multilayer printed wiring board. For example, a composition containing at least a thermosetting resin such as an epoxy resin, cyanate ester resin, phenol resin, bismaleimide-triazine resin, polyimide resin, acrylic resin, vinylbenzyl resin and the like and a curing agent thereof can be used. Of these, preferred is a composition containing an epoxy resin as a thermosetting resin, for example, a composition containing an epoxy resin, a thermoplastic resin and a curing agent.

Examples of the epoxy resin include bisphenol A type epoxy resins, biphenyl type epoxy resins, naphthol type epoxy resins, naphthalene type epoxy resins, bisphenol F type epoxy resins, phosphorus containing epoxy resins, bisphenol S type epoxy resins, alicyclic epoxy resins, aliphatic chain epoxy resins, phenol novolac type epoxy resins, cresol novolac type epoxy resins, bisphenol A novolac type epoxy resins, epoxy resins having butadiene structure, diglycidyl etherified products of bisphenol, diglycidyl etherified products of naphthalenediol, glycidyl etherified products of phenols, and diglycidyl etherified products of alcohols, and an alkyl substituted products of these epoxy resins, halide and hydrogenated products and the like. Any one kind of these epoxy resins may be used alone or two or more kinds thereof may be mixed.

As the epoxy resin, bisphenol A type epoxy resins, naphthol type epoxy resins, naphthalene type epoxy resins, biphenyl type epoxy resins and epoxy resins having butadiene structure are preferable, from the aspects of heat resistance, insulation reliability and close adhesion to metal films. Specifically, for example, liquid bisphenol A type epoxy resins ("Epikote 828EL" manufactured by Japan Epoxy Resins Co., Ltd.), naphthalene type bifunctional epoxy resins ("HP4032", "HP4032D" manufactured by Dainippon Ink and Chemicals, Incorporated), naphthalene type tetrafunctional epoxy resins ("HP4700" manufactured by Dainippon Ink and Chemicals, Incorporated), naphthol type epoxy resins ("ESN-475V" manufactured by Tohto Kasei Co., Ltd.), epoxy resins having a butadiene structure ("PB-3600" manufactured by DAICEL CHEMICAL INDUSTRIES, LTD.), epoxy resins having a biphenyl structure ("NC3000H", "NC3000L" manufactured by Nippon Kayaku Co., Ltd., "YX4000" manufactured by Japan Epoxy Resins Co., Ltd.) and the like can be mentioned.

The prepreg may contain a thermoplastic resin for the purpose of, for example, conferring adequate flexibility to the composition after curing and the like. Examples of such thermoplastic resin include phenoxy resins, polyvinyl acetal resins, polyimides, polyamideimides, polyethersulfones, polysulfones, and the like. Any one kind of these epoxy resins may be used alone or two or more kinds thereof may be mixed. The thermoplastic resin is preferably added in a proportion of 0.5 to 60 mass %, more preferably 3 to 50 mass %, relative to a nonvolatile components in the thermosetting resin composition as 100 mass %.

Specific examples of the phenoxy resin include FX280, FX293 manufactured by Tohto Kasei Co., Ltd., YX8100, YL6954, YL6974 manufactured by Japan Epoxy Resins Co., Ltd. and the like.

The polyvinyl acetal resin is preferably a polyvinyl butyral resin. Specific examples of the polyvinyl acetal resin include Denka Butyral 4000-2, 5000-A, 6000-C, 6000-EP manufactured by DENKI KAGAKU KOGYO KABUSHIKI KAISHA, S-LEC BH series, BX series, KS series, BL series, BM series manufactured by SEKISUI CHEMICAL CO., LTD. and the like.

Specific examples of the polyimide include polyimide "RIKACOAT SN20" and "RIKACOAT PN20" manufactured by New Japan Chemical Co., Ltd. Moreover, linear polyimide obtained by reacting a denatured polyimide such as bifunctional hydroxyl group-terminated polybutadiene, a diisocyanate compound and tetrabasic acid anhydride (one described in JP-A-2006-37083), polyimide having a polysiloxane skeleton (those described in JP-A-2002-12667, JP-A-2000-319386 etc.) and the like can be mentioned.

Specific examples of the polyamideimide include polyamideimide "VYLOMAX HR11NN", "VYLOMAX HR16NN" manufactured by Toyobo Co., Ltd. and the like. In addition, the polyamideimide in the present invention is a concept including denatured polyamideimide such as polyamideimide containing polysiloxane skeleton and the like. Specific examples of the polyamideimide containing a polysiloxane skeleton include "KS9100", "KS9300" manufactured by Hitachi Chemical Co., Ltd. and the like.

Specific examples of the polyethersulfone include polyethersulfone "PES5003P" manufactured by Sumitomo Chemical Co., Ltd. and the like.

Specific examples of the polysulfone include polysulfone "P1700", "P3500" manufactured by Solvay Advanced Polymers K.K and the like.

Examples of the curing agent include amine series curing agents, guanidine series curing agents, imidazole series curing agents, phenol series curing agents, naphthol series curing agents, acid anhydride series curing agents, epoxy adducts thereof, microencapsulated products thereof, cyanate ester resins and the like. Of these, phenol series curing agents, naphthol series curing agents, and cyanate ester resins are preferable. In the present invention, the curing agent may be used alone or in a combination of two or more kinds.

Specific examples of the phenol series curing agents and naphthol series curing agents include MEH-7700, MEH-7810, MEH-7851 manufactured by Meiwa Plastic Industries, Ltd, NHN, CBN, GPH manufactured by Nippon Kayaku Co., Ltd., SN170, SN180, SN190, SN475, SN485, SN495, SN375, SN395 manufactured by Tohto Kasei Co., Ltd., LA7052, LA7054, LA3018, LA1356 manufactured by Dainippon Ink and Chemicals, Incorporated and the like.

In addition, specific examples of the cyanate ester resin include bifunctional cyanate resins such as bisphenol A dicyanate, polyphenol cyanate(oligo(3-methylene-1,5-phenylene cyanate)), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl)thioether, bis(4-cyanatephenyl)ether and the like, multifunctional cyanate resins derivatized from phenol novolac, cresol novolac and the like, prepolymers wherein these cyanate resins are partly converted into triazine and the like. Examples of the commercially available cyanate ester resin include phenol novolac type multifunctional cyanate ester resin ("PT30" manufactured by Lonza Japan Ltd., cyanate equivalent 124), prepolymer wherein bisphenol A dicyanate is partly or entirely triazined into a trimer ("BA230" manufactured by Lonza Japan Ltd., cyanate equivalent 232) and the like.

The mixing ratio of the thermosetting resin and the curing agent is appropriately determined according to the kinds of the thermosetting resin and the curing agent and the like. When the thermosetting resin is an epoxy resin, for example, the mixing ratio of the epoxy resin and the curing agent in the case of phenol series curing agent or naphthol series curing agent is preferably a ratio of phenolic hydroxyl group equivalent of the curing agent of within the range of 0.4 to 2.0, more preferably within the range of 0.5 to 1.0, relative to 1 epoxy equivalent of the epoxy resin. In the case of a cyanate ester resin, the ratio of a cyanate equivalent is preferably within the range of 0.3 to 3.3, more preferably 0.5 to 2, relative to 1 epoxy equivalent, is preferable.

The mixing ratio of the thermosetting resin and the curing agent is appropriately determined according to the kinds of the thermosetting resin and the curing agent and the like. When the thermosetting resin is an epoxy resin, for example, the mixing ratio of the epoxy resin and the curing agent in the case of phenol series curing agent or naphthol series curing agent is preferably a ratio of phenolic hydroxyl group equivalent of the curing agent of within the range of 0.4 to 2.0, more preferably within the range of 0.5 to 1.0, relative to 1 epoxy equivalent of the epoxy resin. In the case of a cyanate ester resin, the ratio of a cyanate equivalent is preferably within the range of 0.3 to 3.3, more preferably 0.5 to 2, relative to 1 epoxy equivalent, is preferable.

The thermosetting resin composition can further contain, in addition to a curing agent, a curing accelerator. Examples of such curing accelerator include imidazole series compounds, organic phosphine series compounds, and the like, and specific examples include 2-methylimidazole, triphenylphosphine, and the like. When a curing accelerator is used, it is preferably used in a proportion of 0.1 to 3.0 mass % relative to the epoxy resin. When a cyanate ester resin is used as the epoxy resin curing agent, an organic metal compound conventionally used as a curing catalyst in a system using an epoxy resin composition and a cyanate compound in combination may be added to shorten the curing time. Examples of such organic metal compounds include organic copper compounds such as copper(II) acetylacetonate and the like, organic zinc compounds such as zinc(II) acetylacetonate and the like, organic cobalt compounds such as cobalt(II) acetylacetonate, cobalt(III) acetylacetonate and the like and the like, which may be used alone or in a combination of two or more kinds. The amount of the organic metal compound to be added is generally within the range of 10 to 500 ppm, preferably 25 to 200 ppm, based on the metal, relative to the cyanate ester resin.

The thermosetting resin composition may contain an inorganic filler for low thermal expansion of the composition after curing. Examples of such inorganic fillers include silica, alumina, isinglass, mica, silicate, barium sulfate, magnesium hydroxide, titanium oxide, and the like. Of these, silica and alumina are preferable, and silica is particularly preferable. From the aspect of insulation reliability, the inorganic filler preferably has an average particle size of not more than 3 μm, more preferably not more than 1.5 μm. The content of the inorganic filler in the thermosetting resin composition is preferably 20 to 60 mass %, more preferably 20 to 50 mass %, when the nonvolatile component of the thermosetting resin composition is 100 mass %.

Moreover, the thermosetting resin composition can contain other components where necessary. Examples of other components include flame retardants such as organic phosphorus series flame retardants, organic nitrogen-containing phosphorus compounds, nitrogen compounds, silicone series flame retardants, metal hydroxides, and the like; organic fillers such as silicone powder, nylon powder, fluorine powder and the like; thickeners such as ORBEN, BENTON and the like; polymeric antifoaming agents or leveling agents such as silicone series, fluorine series and the like; close adhesion imparting agents such as imidazole series, thiazole series, triazole series, and silane series coupling agents and the like; colorants such as phthalocyanine blue, phthalocyanine green, iodine green, disazo yellow, carbon black etc. and the like.

The prepreg to be used in the present invention can be produced by a known hot-melt method, a solvent method and the like. According to the hot-melt method, a prepreg is produced by once coating, without dissolving a thermosetting resin composition in an organic solvent, a thermosetting resin composition to a releasing paper showing good release property from the composition and laminating same on a sheet-like fiber substrate, or directly coating same with a die coater and the like. According to the solvent method, a sheet-like fiber substrate is immersed in a resin composition varnish obtained by dissolving a thermosetting resin composition in an organic solvent to allow the sheet-like fiber substrate to be impregnated with the resin composition varnish, and dried thereafter. It is also possible to prepare a prepreg by continuously laminating adhesive films comprised of a thermosetting resin composition, which are laminated on plastic films, under the conditions of heating and pressurizing from both surfaces of a sheet-like fiber substrate. Examples of the organic solvent used for preparing the varnish include ketones such as acetone, methylethyl ketone, cyclohexanone, and the like, acetic acid esters such as ethyl acetate, butyl acetate, cellosolve acetate, propylene glycol monomethylether acetate, carbitol acetate, and the like, carbitols such as cellosolve, butyl carbitol, and the like, aromatic hydrocarbons such as toluene, xylene, and the like, dimethylformamide, dimethylacetamide, N-methylpyrrolidone, and the like. Such organic solvents may be used alone or in a combination of two or more kinds.

While the drying conditions are not particularly limited, when a prepreg is to be laminated on a circuit substrate and the like, it is important to suppress progression of the curing of the thermosetting resin composition during drying, in order to retain the adhesive power of the prepreg. Since swelling is developed after curing when an organic solvent remains in a large amount in the prepreg, the prepreg is dried to a content of the organic solvent in the thermosetting resin composition of generally 5 wt % or less, preferably 2 wt % or less. While specific drying conditions vary depending on the curing property of the thermosetting resin composition and the amount of the organic solvent in the varnish, for example, a varnish containing 30 to 60 wt % of an organic solvent is dried generally at a temperature of 80° C. to 180° C. for about 3-13 minutes. Those of ordinary skill in the art can appropriately determine preferable drying conditions by a simple experiment.

The thickness of a prepreg (thickness after drying when formed by a solvent method) is preferably 20 to 100 μm. A thickness within this range is advantageous for producing a flat and thin insulating layer. To be precise, when a prepreg has a thickness of less than 20 μm, the prepreg cannot be easily laminated on a circuit substrate with sufficiently high flat characteristic, and when it exceeds 100 μm, a multilayer printed wiring board cannot be advantageously made thinner.

Figure 4:
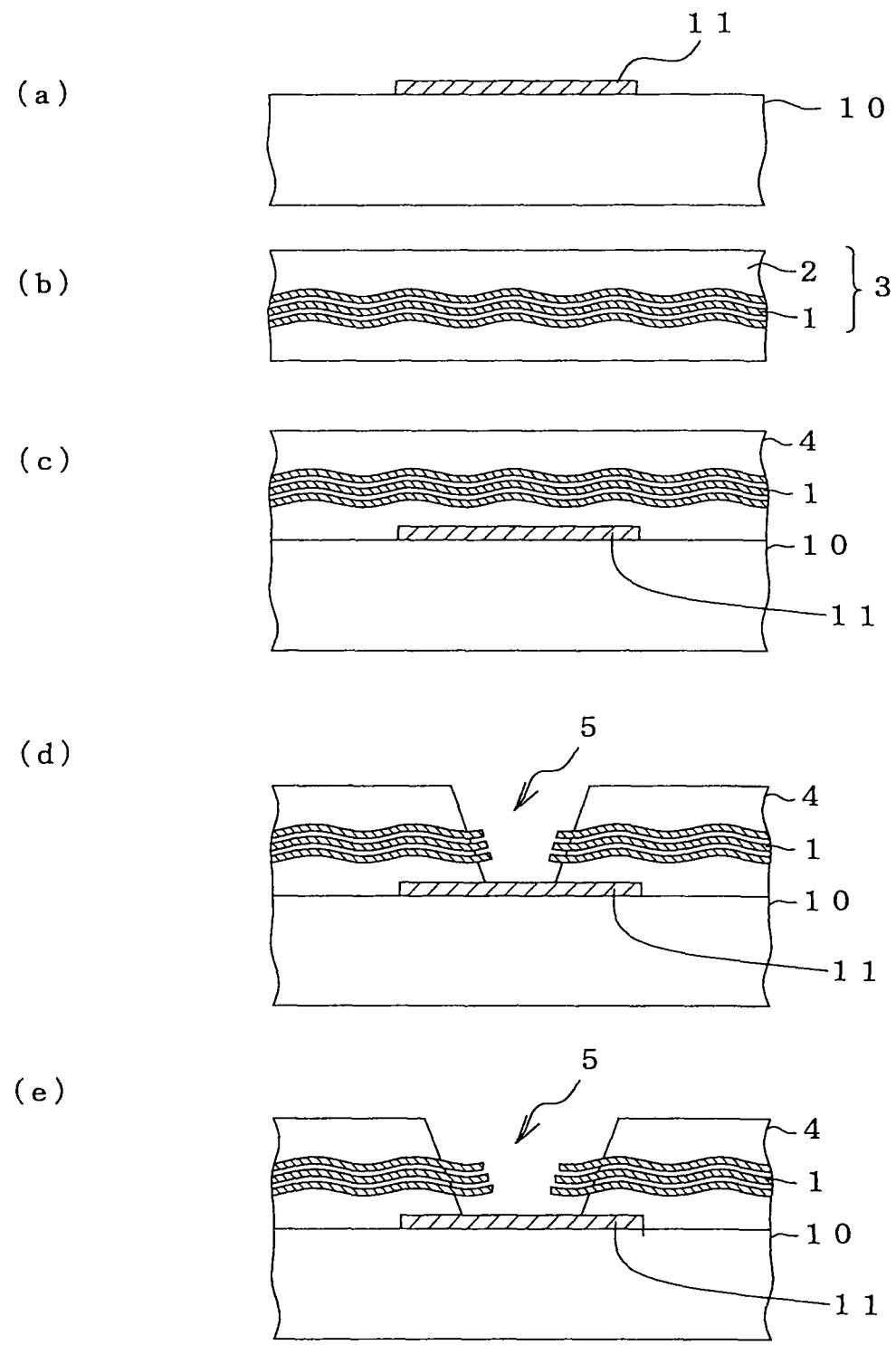
FIG. 4(a) to FIG. 4(e) are sectional views of the steps up to the desmear treatment in the production steps of a conventional multilayer printed wiring board.
Figure 5:
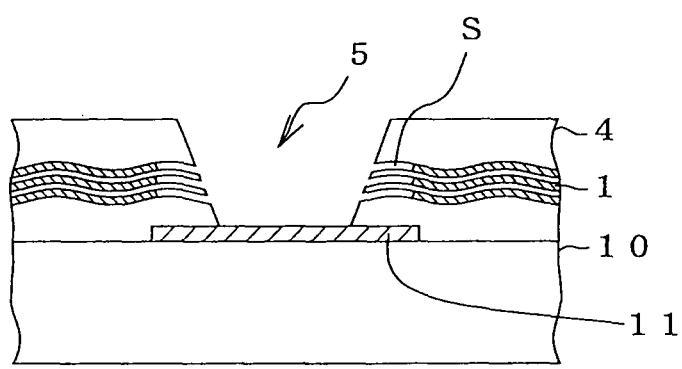
FIGS. 5(a) and (b) are sectional views of a glass etching step and a via formation step in the production steps of a conventional multilayer printed wiring board.
Figure 5:
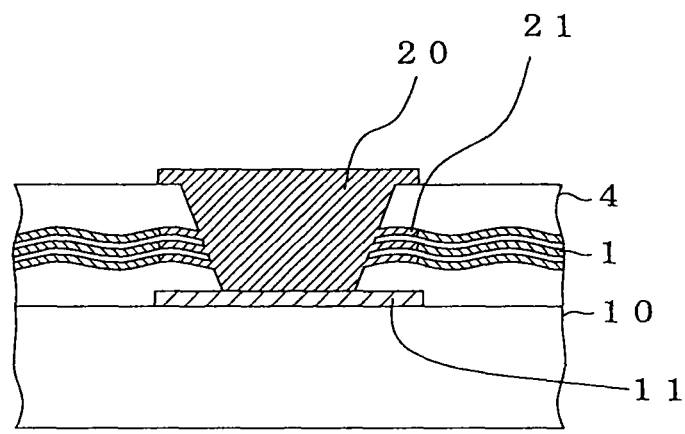

FIG. 1(a) to FIG. 1(f) are sectional views of the steps of one embodiment of the production method of the multilayer printed wiring board of the present invention, using the aforementioned prepreg. In the Figures, the same symbols as in FIG. 4 show the same or the corresponding parts.

First, a prepreg 3 comprised of a glass cloth 1 impregnated with a thermosetting resin composition 2 and a circuit substrate 10 are prepared (FIGS. 1(a) and (b)), a prepreg 3 is laminated on at least one surface of the circuit substrate 10 to cover a conductive circuit layer (pad) 11 on the surface of the circuit substrate 10, and the thermosetting resin composition 2 is cured to give an insulating layer 4 (FIG. 1(c)). While one sheet of prepreg (one layer) is basically laminated on the circuit substrate 10 of the prepreg 3 as shown in FIG. 1(c), not less than 2 sheets (2 layers) may be laminated. The thickness of the insulating layer 4 is basically that of the prepreg 3. Accordingly, the thickness of the insulating layer 4 is preferably 20 to 100 μm, more preferably 30 to 70 μm.

The constitution ratio of the glass cloth and the resin composition in the insulating layer 4 is determined by the constitution ratio of the glass cloth and the resin composition of prepreg 3. It also varies depending on the density of glass cloth, cloth weight and the like. However, to embed a conductive circuit layer (pad) 11 on the surface of the circuit substrate 10 (i.e., to embed the entirety of the conductive circuit layer 11 (pad)), the prepreg should contain a sufficient amount of resin. Thus, the constitution ratio of the glass cloth and the resin composition is generally preferably 1:0.65 to 9, more preferably 1:4 to 5, in a mass ratio (glass cloth:resin composition). The mass of the resin composition in the prepreg can be obtained from the difference in the prepreg mass and the glass cloth mass.

To form an insulating layer 4 by thermally curing prepreg 3 (thermosetting resin composition 2), a conventionally known method for forming an insulating layer of a circuit substrate with a prepreg can be used. For example, a prepreg is laminated on one or both surfaces of a circuit substrate, the laminate is heated and pressed using a metal plate such as SUS panel and the like via a releasing sheet under reduced pressure. The pressure is preferably 5 to 40 kgf/cm$^2$ (49×10$^4$–392×10$^4$ N/m$^2$), the temperature is preferably 120 to 200° C., and the pressing time is preferably 15 to 100 minutes.

While the thermal curing conditions vary depending on the kind and the like of the thermosetting resin composition, the curing temperature is generally about 120 to 200° C., and suitable curing time is about 15 to 100 minutes.

As shown in FIG. 1(d), a via hole (blind via) 5 is formed by laser irradiation in an insulating layer 4 obtained by thermally curing prepreg 3 (thermosetting resin composition 2). In this case, glass cloth 1 protrudes from the sidewall surface of the via hole 5 (FIG. 1(d)) due to the difference in the processability of glass cloth 1 and insulating layer 4 (cured product of thermosetting resin composition 2).

As the above-mentioned laser, carbon dioxide gas laser, YAG laser, excimer laser and the like can be mentioned, with particular preference given to carbon dioxide gas laser from the aspects of processing rate and cost.

For high density wiring of a multilayer printed wiring board, the top diameter of via hole 5 is preferably not more than 75 μm, more preferably not more than 70 μm, still more preferably not more than 67 μm. For a small diameter via hole having a top diameter of not more than 75 μm, protrusion of a glass cloth from the sidewall surface of a via hole becomes a more noticeable problem, where the production method of the present invention proves to be particularly advantageous.

After forming the via hole 5, glass cloth 1 protruding from the wall surface of via hole 5 is etched with a glass etching solution to eliminate protrusion of glass cloth 1 from the wall surface of via hole 5 (FIG. 1(e)). As a glass etching solution here, known ones such as a hydrogen fluoride solution, fluoroboric acid solution, ammonium fluoride solution and the like can be used. Examples of the commercially available glass etching solution include "Enplate MLB GLASS ETCH ADDITIVE" manufactured by Meltex Inc. and the like. A commercially available glass etching solution is generally diluted before use. For example, when the glass etching solution is a fluoroboric acid solution, the concentration of fluoroboric acid is generally about 50 g/L, and the solution is diluted with ion exchange water, distilled water, etc. to the range of 5 ml/L to 200 mL/L, preferably 10 mL/L to 100 mL/L, before use. As an etching method, a method including immersing a laminate having a via hole in the solution, and a method including spraying the solution in a via hole may be mentioned, and the spray method is superior in the penetration of solution in the via hole. To suppress the protrusion length of glass cloth 1 after the below-mentioned desmear treatment, etching of glass cloth using these solutions is preferably performed to etch the glass cloth from the via sidewall surface to the inside of the resin (insulating layer 4), taking into consideration the scraping off of the via sidewall by a desmear treatment, and generally up to about 2 μm from the via sidewall surface, and inside the resin (insulating layer 4). Therefore, a clearance S having an opening on the sidewall surface of a via hole 5 can be formed by an etching treatment with the glass etching solution (see, FIG. 1(e)).

After the etching treatment of glass cloth 1 using the above-mentioned glass etching solution, via hole 5 is subjected to a desmear treatment (FIG. 1(f)). For such desmear treatment, a method including immersing a laminate having a via hole 5 in an oxidizing agent solution and a method including spraying an oxidizing agent solution into a via hole are available. Examples of the oxidizing agent solution include concentrated sulfuric acid, chromic acid or a mixed acid thereof, or aqueous alkaline permanganate solution (aqueous sodium permanganate solution, aqueous potassium permanganate solution) and the like, with preference given to aqueous alkaline permanganate solution. Such oxidizing agent solutions are commercially available as chemicals for printed wiring boards, and commercially available products can be used as they are. For example, as the aqueous alkaline permanganate solution, "Enplate MLB-497" manufactured by Meltex Inc. and the like can be mentioned. By the desmear treatment, a cured product (resin cured product) of a thermosetting resin composition on the sidewall of via hole 5 is scraped off by the oxidizing agent, and the aforementioned clearance S having an opening on the sidewall surface of a via hole 5 (see, FIG. 1(e)), which is formed by the etching treatment of the glass cloth, can be eliminated. To certainly eliminate clearance S, the desmear treatment needs to be performed sufficiently. Although, a tip of the glass cloth 1 may be protruded somewhat, the protrusion amount thereof can be small, and strikingly smaller than that formed during the laser processing (FIG. 1(d)) for forming via hole 5 (FIG. 1(f)). To improve flow of the plating solution in the via hole, the protrusion length of glass cloth 1 from the sidewall of via hole after desmear treatment is preferably not more than 6 μm, more preferably not more than 5 μm, still more preferably not more than 4 μm, and further preferably not more than 3 μm.

In the desmear treatment with an aqueous alkaline permanganate solution, a swelling treatment with a swelling agent solution is preferably performed prior to the treatment with an aqueous alkaline permanganate solution, and an aftertreatment (neutralization treatment) with a reducing agent solution is preferably performed after treatment with an aqueous alkaline permanganate solution. The swelling agent solution and reducing agent solution are commercially available as chemicals for printed wiring boards, and commercially available products can be used as they are. Examples of the swelling agent solution include "Melplate MLB-6001" manufactured by Meltex Inc., "Melplate MLB-495" manufactured by the same, "Melplate MLB-496" manufactured by the same and the like, and examples of the reducing agent solution include "Enplate MLB-790M" manufactured by Meltex Inc. and the like.

The desmear treatment of a via hole with an oxidizing agent solution may also function as a roughening treatment of the surface of an insulating layer. In this case, considering the ultrafine wiring formation and close adhesion strength of wiring, the surface roughness of the insulating layer 4 after the roughening treatment is desirably not less than 0.1 μm and not more than 1.5 μm in the surface roughness Ra value. The surface roughness Ra value is one kind of the numerical values showing the surface roughness, and called arithmetic mean roughness. To be specific, it is obtained by measuring the absolute value of height, which changes within the measurement region, from the surface as a mean line and calculating the arithmetic mean. For example, it is obtained from the numerical value obtained using WYKO NT3300 manufactured by Veeco Instruments Inc. and at VSI contact mode with the range of measurement with 50× lens of 121 μm×92 μm.

In JP-A-2005-86164, a problem is pointed out that, due to the attachment of a matrix resin melted by laser irradiation to a glass cloth, fluoride does not contact the glass cloth and resists effective removal by etching. According to the study of the present inventors, such problem could not be noted. This is considered to be attributable to the difference resulting from the different curing states of a matrix resin by different processes between JP-A-2005-86164 and the present invention, since a method described in JP-A-2005-86164 includes simultaneous thermal curing by heat pressing a prepreg and a copper to form an insulating layer and a conductive layer at the same time in one sitting, but the Examples of the present invention employ a process substantially including a two-step thermal curing treatment to form a conductive layer by plating, wherein a prepreg laminated on a circuit substrate is subjected to a thermal curing and an annealing treatment after formation of a conductive layer.

A circuit substrate having an insulating layer in the present invention may form, where necessary, a penetration hole (through hole). A penetration hole can be formed by a conventionally known method, and a machine drill is generally used. In addition, a method including chemically processing a copper foil surface and applying laser irradiation can also be used. In a multilayer printed wiring board, a penetration hole is generally formed in a core substrate. In a built-up insulating layer such as the insulating layer 4 in the present invention, conduction is generally achieved by a via hole.

The production method of a multilayer printed wiring board of the present invention may further include, after formation of a via hole in the aforementioned insulating layer, glass etching treatment and desmear treatment, plating process for forming a conductive layer in an insulating layer surface by plating and, after conductive layer formation, annealing treatment of the circuit substrate by heating, and formation of a circuit in the conductive layer. These steps can be performed according to various methods known to those of ordinary skill in the art and used for the production of multilayer printed wiring boards.

In the plating process for forming a conductive layer by plating, when the surface of an insulating layer is roughened, close adhesion of the conductive layer to the insulating layer can be improved by an anchoring effect. As mentioned above, therefore, in the desmear treatment after etching treatment of glass cloth, the insulating layer is preferably subjected to a simultaneous surface roughening treatment. In the plating process, plating is also formed in the via hole.

A conductive layer can be formed by plating by a method combining electroless plating and electrolytic plating. Alternatively, a plating resist having a reverse pattern from that of the conductive layer is formed, and a conductive layer can be formed by electroless plating alone. The conductive layer can be generally formed of copper, gold, silver, nickel, tin, etc., and copper is preferable. An electroless plating layer has a thickness of preferably 0.1 to 3 μm, more preferably 0.3 to 2 μm, and the electrolytic plating layer has a thickness that makes the total thickness with the thickness of the electroless plating layer preferably 3 to 35 μm, more preferably 5 to 20 μm. In addition, a via hole may have a via filled by plating, successively from the formation of a conductive layer.

An annealing treatment can be performed after, for example, conductive layer formation, by heating the circuit substrate (the insulating layer and the conductive layer) at a temperature of about 150 to 200° C. for about 20 to 90 minutes. By an annealing treatment, the peeling strength of the conductive layer can be further improved and stabilized.

For a circuit formation step, for example, a subtractive process, semi-additive process and the like can be used. For fine line formation, a semi-additive process is preferable, wherein a pattern resist is applied onto an electroless plating layer, an electrolytic plating layer (pattern plating layer) having a desired thickness is formed, the pattern resist is detached and an electroless plating layer is remove by flash etching to give a circuit.

Figure 2:
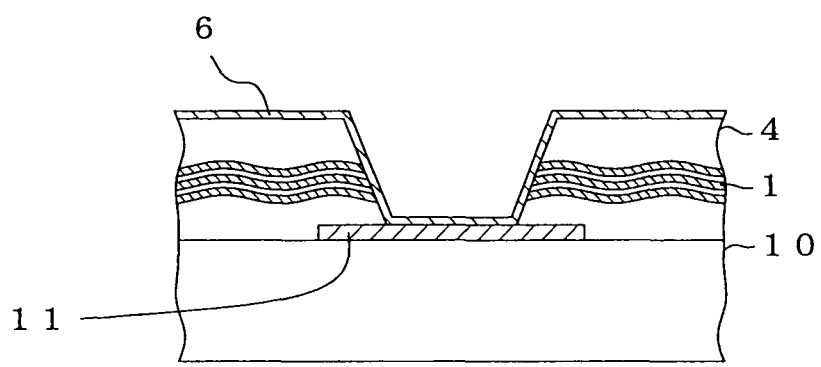
FIG. 2(a) to FIG. 2(c) are step sectional views of the steps for forming a circuit containing a via in the production method of the multilayer printed wiring board of the present invention.
Figure 2:
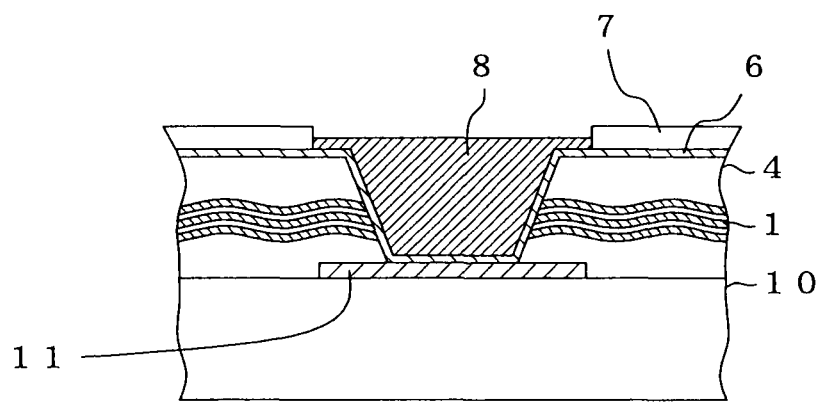
Figure 2:
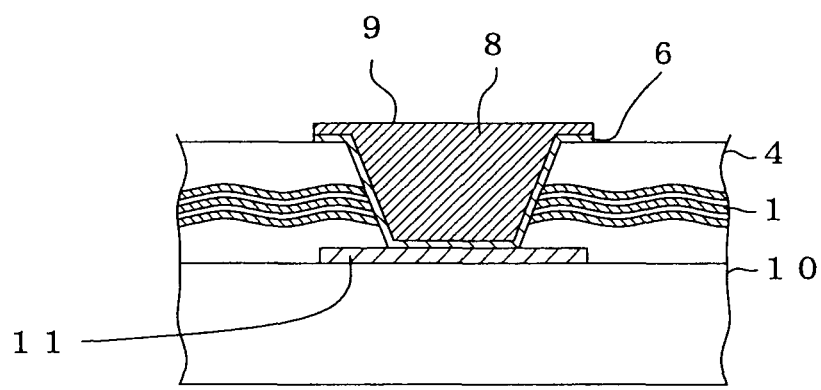

FIG. 2(a) to FIG. 2(c) show one embodiment of a series of steps from a conductive layer to circuit formation. A seed layer (conductive layer) 6 is formed on the surface of an insulating layer 4 and inside of via hole 5 by electroless plating (FIG. 2(a)), a pattern resist 7 is applied onto the seed layer 6, an electrolytic plating layer (pattern plating layer) 8 that completely fills a via hole is formed (FIG. 2(b)), thereafter the pattern resist 7 is detached and the electroless plating layer 8 is removed by flash etching, whereby a circuit having a filled via 9 is formed (FIG. 2(c)).

As explained above, according to the method of the present invention, the protrusion length of glass cloth 1 from the wall surface of via hole 5 formed in an insulating layer 4 containing glass cloth 1 is sufficiently small, and the etch back phenomenon can be suppressed. Therefore, a highly reliable via 9 can be certainly formed. That is, a multilayer printed wiring board with a circuit containing via 9, wherein insulating layer 4 containing glass cloth 1 is formed by a build-up process, glass cloth 1 protrudes in a length of 6 μm or less from the sidewall of via hole 5 formed in the insulating layer 4, and the protrusion part of the glass cloth 1 is embedded in a conductive layer (seed layer 6 and electrolytic plating layer 8) forming via 9, can be obtained.

The circuit substrate to be used for the production of the multilayer printed wiring board of the present invention mainly refers to a glass epoxy substrate, a metal substrate, a polyester substrate, a polyimide substrate, a BT resin substrate, a thermosetting polyphenylene ether substrate and the like, wherein one or both surfaces thereof have a pattern processed conductive layer (circuit). The circuit substrate in the present invention also encompasses an internal-layer circuit substrate of an intermediate product, on which an insulating layer and/or a conductive layer will be formed for the production of a multilayer printed wiring board. The surface of a conductive circuit layer is preferably roughened in advance by a blackening treatment and the like, since close adhesion of an insulating layer to a circuit substrate can be achieved.

Other features of the invention will become apparent in the course of the following descriptions of exemplary embodiments which are given for illustration of the invention and are not intended to be limiting thereof.

EXAMPLES

In the following description, "part" means "parts by mass". Production of prepreg.

Liquid bisphenol A type epoxy resin (epoxy equivalents 180, "Epikote 828EL" manufactured by Japan Epoxy Resins Co., Ltd., 28 parts) and naphthalene type tetrafunctional epoxy resin (epoxy equivalents 163, "HP4700" manufactured by Dainippon Ink and Chemicals, Incorporated, 28 parts) were dissolved in a mixed solvent of methylethyl ketone (hereinafter to be abbreviated as "MEK", 15 parts) and cyclohexanone (15 parts) with stirring while heating. Thereto were added a MEK solution (110 parts) of a naphthol series curing agent ("SN-485" manufactured by Tohto Kasei Co., Ltd., phenolic hydroxyl group equivalents 215) having a solid content of 50%, a curing catalyst ("2E4MZ" manufactured by SHIKOKU CHEMICALS CORPORATION, 0.1 part), spherical silica (average particle size 0.5 µm, "S0-C2" manufactured by Admatechs Company Limited, 70 parts), and a polyvinyl butyral resin solution (solution of "KS-1" manufactured by SEKISUI CHEMICAL CO., LTD. in a 1:1 (mass ratio) mixed solvent of ethanol and toluene, having a solid content of 15% (mass %), 30 parts), and the mixture was uniformly dispersed in a high-speed rotation mixer to give a resin varnish.

A 1027MS glass cloth manufactured by Asahi-Schwebel Co., Ltd. (thickness 19 µm) was impregnated with the resin varnish, and dried at 80 to 120° C. for 6 minutes to give a prepreg having a thickness of 50 µm. A poly(ethylene terephthalate) film (thickness 38 µm, hereinafter to be abbreviated as "PET film") from one side and a polypropylene film (protection film) having a thickness of 15 µm from the opposite side were thermally laminated thereon, and the laminate was wound in a roll. Then, the roll was slit at width 502 mm to give two 50 m wound prepregs with PET film (constitution ratio of glass cloth and resin composition (mass ratio) was 1:5).

Example 1

A protection film-detached prepreg with PET film was laminated on both sides of a copper-clad laminate plate (circuit substrate) having a thickness of 0.2 mm after circuit formation (circuit conductor thickness 18 µm). The PET film was detached, and the laminate was thermally cured to form an insulating layer having a thickness of 32 µm on both surfaces of the above-mentioned circuit substrate. Then, a via hole having a top diameter 60 µm, a bottom diameter 50 µm was formed in the insulating layer laminated on one surface of the circuit substrate by carbon dioxide gas laser.

The resulting circuit substrate was immersed in an aqueous solution, which was obtained by diluting a glass etching solution ("Enplate MLB GLASS ETCH ADDITIVE" manufactured by Meltex Inc.) containing fluoroboric acid at a concentration of about 50 g/L with ion exchange water to a concentration of 20 mL/L, at 40° C. for 5 minutes for etching of the glass cloth. Then the via hole was subjected to a desmear treatment. The desmear treatment also functions as a roughening treatment of the surface of an insulating layer, and includes immersing in "Melplate MLB-6001" manufactured by Meltex Inc. as a swelling agent solution at 60° C. for 5 minutes, immersing in "Enplate MLB-479" manufactured by Meltex Inc., which is an aqueous alkaline permanganate solution, as an oxidizing agent solution at 80° C. for 20 minutes and immersing in "Enplate MLB-790" manufactured by Meltex Inc. as a reducing agent solution at 40° C. for 5 minutes.

After the glass etching treatment and the desmear treatment (roughening treatment), the section of the via hole in the circuit substrate was observed by a scanning electron microscope (SEM) manufactured by Hitachi High-Technologies Corporation, type "SU-1500", and the length of clearance in the via hole sidewall (i.e., length of clearance S having an opening on the sidewall surface of a via hole shown in FIG. 1(*e*)) and the protrusion length of glass cloth were measured.

The measurement was performed in the via hole formed at the crossing point of fiber bundles having a high glass cloth density in the circuit substrate, and the longest clearance length and the longest protrusion length on an SEM photograph were taken as the representative values.

Figure 3:
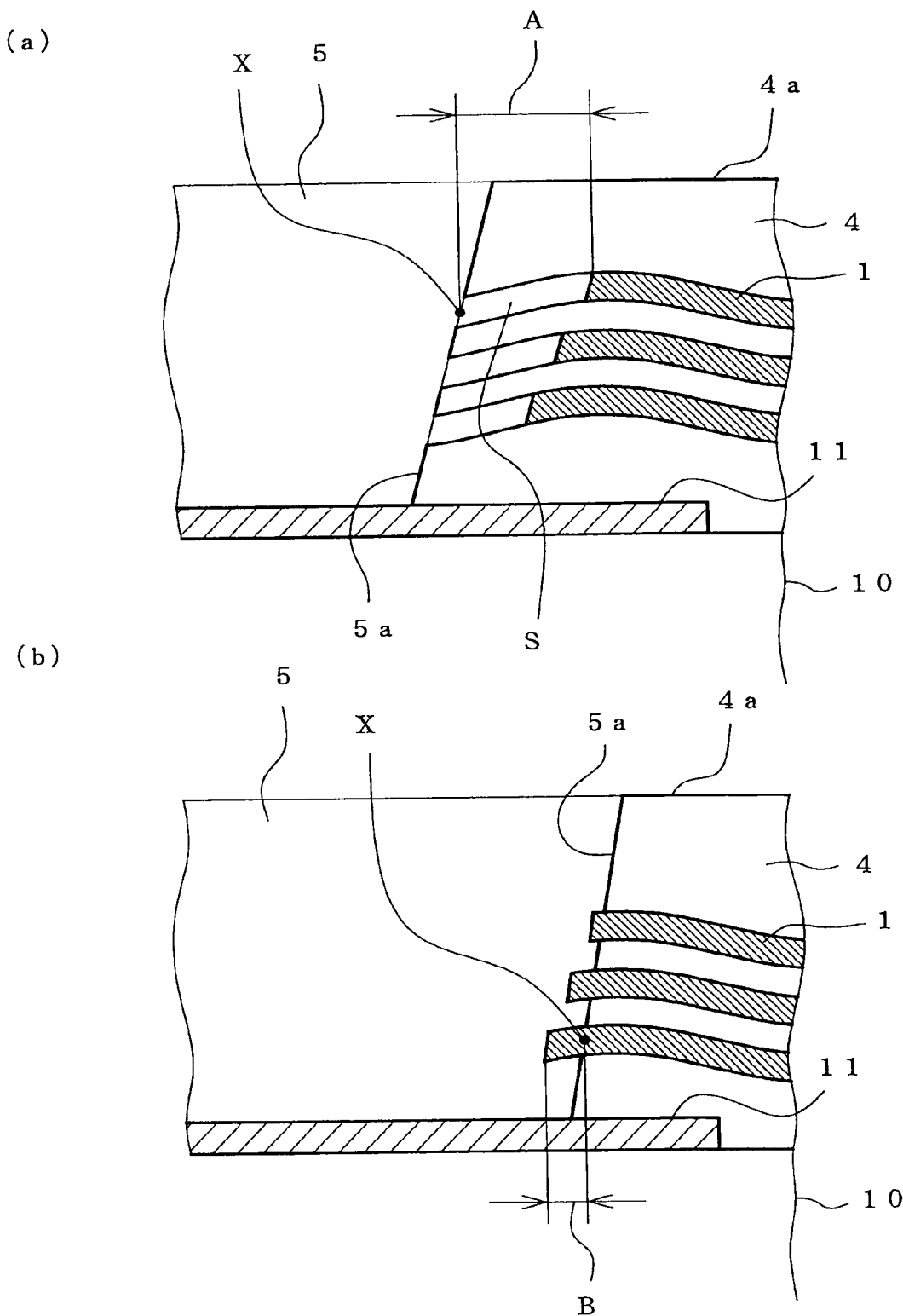
FIGS. 3(a) and (b) are figures to show definition of the "clearance length" and "protrusion length" in the present invention.

The "clearance length" is defined on an SEM photograph, as shown in the schematic diagram of FIG. 3(*a*), to be the linear distance A in the horizontal direction (i.e., direction parallel to upper surface 4a of insulating layer 4) between reference point X, which is an approximate center the opening of the clearance S in the sidewall 5a in via hole 5, and the farthest position of the clearance S from the sidewall 5a. The "protrusion length" is defined on an SEM photograph, as shown in the schematic diagram of FIG. 3(*b*), to be the linear distance B in the horizontal direction (i.e., direction parallel to upper surface 4a of insulating layer 4) between reference point X, which is an approximate center of the root of the protrusion part of the glass cloth 1 protruding from the sidewall 5a in via hole 5, and the tip of glass cloth.

After the glass etching treatment, a part of the circuit substrate was separated. The clearance length in the via hole of the separated circuit substrate was measured, the rest of the circuit substrate was subjected to a desmear treatment, and the protrusion length of the glass cloth in the via hole of the rest of the circuit substrate was measured.

In addition, the surface roughness of the insulating layer was measured by the following method to find Ra (arithmetic mean roughness)=800 nm. Measurement of surface roughness of insulating layer.

Using a non-contact type surface roughness meter (WYKO NT3300 manufactured by Veeco Instruments Inc.), Ra (arithmetic mean roughness) of the surface of an insulating layer was determined at VSI contact mode with the range of measurement with 50× lens of 121 µm×92 µm.

Example 2

The operation and measurements in the same manner as in Example 1 were performed except that an aqueous solution obtained by diluting the glass etching solution ("Enplate MLB GLASS ETCH ADDITIVE" manufactured by Meltex Inc.) with ion exchange water to a concentration of 35 mL/L was used. The surface of the insulating layer had an Ra (arithmetic mean roughness) of 800 nm.

Example 3

The operation and measurements in the same manner as in Example 1 were performed except that an aqueous solution obtained by diluting the glass etching solution ("Enplate MLB GLASS ETCH ADDITIVE" manufactured by Meltex Inc.) with ion exchange water to a concentration of 50 mL/L was used. The surface of the insulating layer had an Ra (arithmetic mean roughness) of 800 nm.

Comparative Example 1

The operation and measurements in the same manner as in Example 1 were performed except that the glass etching was omitted.

Comparative Example 2

The operation and measurements in the same manner as in Example 1 were performed except that the glass etching was performed after a roughening treatment (also functioning as a desmear treatment) of the surface of the insulating layer.

Comparative Example 3

The operation and measurements in the same manner as in Example 2 were performed except that the glass etching was performed after a roughening treatment (also functioning as a desmear treatment) of the surface of the insulating layer.

Comparative Example 4

The operation and measurements in the same manner as in Example 3 were performed except that the glass etching was performed after a roughening treatment (also functioning as a desmear treatment) of the surface of the insulating layer.

The results of Examples 1-3 and Comparative Examples 1-4 are summarized in Table 1.

TABLE 1

|  | glass etching step | glass etching solution concentration (mL/L) | protrusion length (·m) of glass cloth | via hole sidewall clearance length (·m) |
|---|---|---|---|---|
| Example 1 | before desmear | 20 | 5 | none |
| Example 2 | before desmear | 35 | 3 | none |
| Example 3 | before desmear | 50 | 2 | none |
| Comparative Example 1 | none | none | 10 | none |
| Comparative Example 2 | after desmear | 20 | 8 | none |
| Comparative Example 3 | after desmear | 35 | 6 | 5 |
| Comparative Example 4 | after desmear | 50 | 3 | 6 |

As is clear from Table 1, in the Examples according to the present invention, clearance on the sidewall of via hole was not found, and the glass cloth protruding from a via hole sidewall could be effectively etched. In contrast, in the Comparative Examples, when the protrusion of the glass cloth was decreased by etching, even the glass cloth in the via hole sidewall was etched to produce a clearance. Thus, effective etching was difficult.

Example 4

The surface of an insulating layer of the laminate and via hole after the desmear treatment (roughening treatment) in Example 3 were treated with a catalyst for electroless copper plating, and subjected to electroless copper plating, followed by electrolytic copper plating with copper sulfate to convert via hole to a filled via.

Example 5

The outermost copper layer (copper layer on insulating layer) of the laminate obtained in Example 4 was etched to form a circuit, whereby a 4-layer printed wiring board was obtained. Then, an annealing treatment was further conducted at 180° C. for 30 minutes. The conductive plating of the obtained conductive layer had a thickness of about 30 μm, and the peeling strength was 0.8 kgf/cm. The peeling strength was evaluated according to the Japanese Industrial Standards (JIS) C6481. In addition, the obtained multilayer printed wiring board was not warped by baking at 255° C.×15 minutes.

Where a numerical limit or range is stated herein, the endpoints are included. Also, all values and subranges within a numerical limit or range are specifically included as if explicitly written out.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

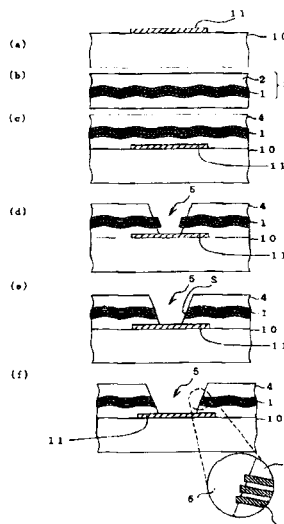

The invention claimed is:

1. A process for making a multilayer printed wiring board, comprising performing steps (i) through (v) in the order of from (i) to (v):
   (i) forming an insulating layer by laminating a prepreg, said prepreg comprising a glass cloth impregnated with a thermosetting resin, on at least one surface of a circuit substrate having a conductive circuit on its surface;
   (ii) forming, by laser irradiation, a via hole in said insulating layer, such that a said conductive circuit is exposed at the bottom of said via hole;
   (iii) subjecting glass cloth projecting into said via hole to a glass etching treatment with a glass etching solution, to obtain a glass etching-treated via hole;
   (iv) subjecting said glass etching-treated via hole to a desmear treatment with an oxidizing agent solution; and
   (v) forming a via which is connected to said conductive circuit by said via hole.

2. The process of claim 1, wherein said via hole has a top diameter of not more than 75 μm and not less than 60 μm.

3. The process of claim 1, wherein said insulating layer is formed by a process comprising:
   laminating said prepreg on at least one surface of said circuit substrate, to obtain a laminate;
   heating and pressing said laminate under reduced pressure; and
   thermally curing said prepreg.

4. The process of claim 1, wherein said desmear treatment comprises treatment with an oxidizing agent solution which is an alkaline permanganate solution.

5. The process of claim 1, wherein said desmear treatment is performed simultaneously with a roughening treatment of said insulating layer surface with said oxidizing agent solution.

6. The process of claim 5, further comprising:
forming a conductive layer on a roughened surface of said insulating layer by plating.

7. The process of claim 6, further comprising:
annealing said insulating layer and said conductive layer after forming said conductive layer.

8. The process of claim 7, further comprising:
forming a circuit on said conductive layer.

9. The process of claim 1, wherein said glass etching treatment in step (iii) is performed by etching the glass cloth from the via sidewall surface to the inside of the insulating layer, and said desmear treatment in step (iv) is performed such that the protrusion length of glass cloth from the sidewall of said via hole after said desmear treatment is not more than 6 μm.

* * * * *

UNITED STATES PATENT AND TRADEMARK OFFICE
CERTIFICATE OF CORRECTION

PATENT NO.        : 8,533,942 B2
APPLICATION NO.   : 12/275481
DATED             : September 17, 2013
INVENTOR(S)       : Seiichiro Ohashi et al.

Page 1 of 1

It is certified that error appears in the above-identified patent and that said Letters Patent is hereby corrected as shown below:

In the Claims

In claim 1
column 16, lines 49-51 should read as:

--(ii) forming, by laser irradiation, a via hold in said insulating layer, such that said conductive circuit is exposed at the bottom of said via hole;--

Insert the following claim at column 17, line 22, after claim 9:

--10. The process of claim 1, wherein said surface of said insulating layer is roughened to have an arithmetic mean roughness (Ra) within the range of 0.1 to 1.5 μm.--

Signed and Sealed this
Fifteenth Day of April, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,533,942 B2 | |
| APPLICATION NO. | : 12/275481 | |
| DATED | : September 17, 2013 | |
| INVENTOR(S) | : Seiichiro Ohashi et al. | |

It is certified that error appears in the above-identified patent and that said Letters Patent is hereby corrected as shown below:

Delete the title page and substitute therefore the attached title page showing the corrected number of claims in patent.

In the Claims

In claim 1
column 16, lines 49-51 should read as:

--(ii) forming, by laser irradiation, a via hold in said insulating layer, such that said conductive circuit is exposed at the bottom of said via hole;--

Insert the following claim at column 17, line 22, after claim 9:

--10. The process of claim 1, wherein said surface of said insulating layer is roughened to have an arithmetic mean roughness (Ra) within the range of 0.1 to 1.5 μm.--

This certificate supersedes the Certificate of Correction issued April 15, 2014.

Signed and Sealed this
Thirteenth Day of May, 2014

Michelle K. Lee
*Deputy Director of the United States Patent and Trademark Office*

CERTIFICATE OF CORRECTION (continued)

(12) United States Patent
Ohashi et al.

(10) Patent No.: US 8,533,942 B2
(45) Date of Patent: Sep. 17, 2013

(54) PRODUCTION METHOD OF MULTILAYER PRINTED WIRING BOARD AND MULTILAYER PRINTED WIRING BOARD

(75) Inventors: Seiichiro Ohashi, Kawasaki (JP); Eiichi Hayashi, Kawasaki (JP); Shigeo Nakamura, Kawasaki (JP); Takaaki Yazawa, Nagano (JP); Junichi Nakamura, Nagano (JP)

(73) Assignees: Ajinomoto Co., Inc., Tokyo (JP); Shinko Electric Industries Co., Ltd., Nagano-shi (JP)

( * ) Notice: Subject to any disclaimer, the term of this patent is extended or adjusted under 35 U.S.C. 154(b) by 614 days.

(21) Appl. No.: 12/275,481

(22) Filed: Nov. 21, 2008

(65) Prior Publication Data

US 2009/0133910 A1 May 28, 2009

(30) Foreign Application Priority Data

Nov. 22, 2007 (JP) ................................. 2007-303737

(51) Int. Cl.
*H05K 3/02* (2006.01)
*H05K 3/10* (2006.01)
*H01K 3/10* (2006.01)

(52) U.S. Cl.
USPC .............................................. 29/846; 29/852

(58) Field of Classification Search
USPC .................. 29/846, 852, 829, 830; 174/255, 174/259, 264, 266
See application file for complete search history.

(56) References Cited

U.S. PATENT DOCUMENTS

| | | | | |
|---|---|---|---|---|
| 5,017,742 A * | 5/1991 | Bladon | ................ | 174/266 |
| 5,352,325 A * | 10/1994 | Kato | ................ | 216/18 |
| 5,527,741 A * | 6/1996 | Cole et al. | ................ | 438/107 |
| 5,906,042 A * | 5/1999 | Lan et al. | ................ | 29/852 |
| 6,054,761 A * | 4/2000 | McCormack et al. | ........ | 257/698 |
| 6,127,633 A * | 10/2000 | Kinoshita | ................ | 174/259 |
| 7,690,110 B2 * | 4/2010 | Whittaker et al. | ........... | 29/852 |
| 7,748,115 B2 * | 7/2010 | Vasudivan et al. | ........... | 29/852 |
| 7,827,680 B2 * | 11/2010 | En et al. | ................ | 29/831 |

(Continued)

FOREIGN PATENT DOCUMENTS

| | | |
|---|---|---|
| JP | 9-116265 | 5/1997 |
| JP | 2000-319386 | 11/2000 |

(Continued)

OTHER PUBLICATIONS

Office Action issued Dec. 18, 2012 in Japanese Patent Application No. 2008-297870 (with English-language translation).

(Continued)

*Primary Examiner* — David Angwin
(74) *Attorney, Agent, or Firm* — Oblon, Spivak, McClelland, Maier & Neustadt, L.L.P.

(57) ABSTRACT

Multilayer printed wiring boards may be prepared by forming a via hole by laser irradiation in insulating layer formed by a prepreg, comprised of a glass cloth impregnated with a thermosetting resin composition, and subjecting the via hole to a glass etching treatment with a glass etching solution and then to a desmear treatment with an oxidizing agent solution. By such a process, etch back phenomenon and excessive protrusion of glass cloth from the wall surface of a via hole can be sufficiently suppressed, and a highly reliable via can be formed. Particularly, a highly reliable via can be formed in a small via hole having a top diameter of 75 μm or below.

10 Claims, 5 Drawing Sheets

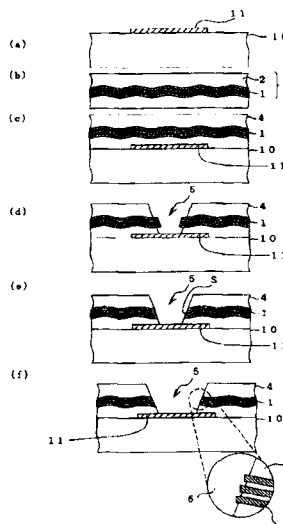

UNITED STATES PATENT AND TRADEMARK OFFICE
CERTIFICATE OF CORRECTION

PATENT NO. : 8,533,942 B2
APPLICATION NO. : 12/275481
DATED : September 17, 2013
INVENTOR(S) : Seiichiro Ohashi et al.

It is certified that error appears in the above-identified patent and that said Letters Patent is hereby corrected as shown below:

Delete the title page and substitute therefore the attached title page showing the corrected number of claims in patent.

In the Claims

In claim 1
column 16, lines 49-51 should read as:

--(ii) forming, by laser irradiation, a via hole in said insulating layer, such that said conductive circuit is exposed at the bottom of said via hole;--

Insert the following claim at column 17, line 22, after claim 9:

--10. The process of claim 1, wherein said surface of said insulating layer is roughened to have an arithmetic mean roughness (Ra) within the range of 0.1 to 1.5 μm.--

This certificate supersedes the Certificates of Correction issued April 15, 2014 and May 13, 2014.

Signed and Sealed this
Ninth Day of September, 2014

Michelle K. Lee
*Deputy Director of the United States Patent and Trademark Office*

(12) United States Patent
Ohashi et al.

(10) Patent No.: US 8,533,942 B2
(45) Date of Patent: Sep. 17, 2013

(54) PRODUCTION METHOD OF MULTILAYER PRINTED WIRING BOARD AND MULTILAYER PRINTED WIRING BOARD

(75) Inventors: Seiichiro Ohashi, Kawasaki (JP); Eiichi Hayashi, Kawasaki (JP); Shigeo Nakamura, Kawasaki (JP); Takaaki Yazawa, Nagano (JP); Junichi Nakamura, Nagano (JP)

(73) Assignees: Ajinomoto Co., Inc., Tokyo (JP); Shinko Electric Industries Co., Ltd., Nagano-shi (JP)

( * ) Notice: Subject to any disclaimer, the term of this patent is extended or adjusted under 35 U.S.C. 154(b) by 614 days.

(21) Appl. No.: 12/275,481

(22) Filed: Nov. 21, 2008

(65) Prior Publication Data
US 2009/0133910 A1 May 28, 2009

(30) Foreign Application Priority Data
Nov. 22, 2007 (JP) .................................. 2007-303737

(51) Int. Cl.
*H05K 3/02* (2006.01)
*H05K 3/10* (2006.01)
*H01K 3/10* (2006.01)

(52) U.S. Cl.
USPC .............................................. 29/846; 29/852

(58) Field of Classification Search
USPC .................... 29/846, 852, 829, 830; 174/255, 174/259, 264, 266
See application file for complete search history.

(56) References Cited

U.S. PATENT DOCUMENTS

| | | | | |
|---|---|---|---|---|
| 5,017,742 A * | 5/1991 | Bladon | ......................... | 174/266 |
| 5,352,325 A * | 10/1994 | Kato | ............................... | 216/18 |
| 5,527,741 A * | 6/1996 | Cole et al. | ....................... | 438/107 |
| 5,906,042 A * | 5/1999 | Lan et al. | ......................... | 29/852 |
| 6,054,761 A * | 4/2000 | McCormack et al. | ......... | 257/698 |
| 6,127,633 A * | 10/2000 | Kinoshita | ....................... | 174/259 |
| 7,690,110 B2 * | 4/2010 | Whittaker et al. | .............. | 29/852 |
| 7,748,115 B2 * | 7/2010 | Vasudivan et al. | .............. | 29/852 |
| 7,827,680 B2 * | 11/2010 | En et al. | ........................... | 29/831 |

(Continued)

FOREIGN PATENT DOCUMENTS

| | | |
|---|---|---|
| JP | 9-116265 | 5/1997 |
| JP | 2000-319386 | 11/2000 |

(Continued)

OTHER PUBLICATIONS

Office Action issued Dec. 18, 2012 in Japanese Patent Application No. 2008-297870 (with English-language translation).

(Continued)

*Primary Examiner* — David Angwin
(74) *Attorney, Agent, or Firm* — Oblon, Spivak, McClelland, Maier & Neustadt, L.L.P.

(57) ABSTRACT

Multilayer printed wiring boards may be prepared by forming a via hole by laser irradiation in insulating layer formed by a prepreg, comprised of a glass cloth impregnated with a thermosetting resin composition, and subjecting the via hole to a glass etching treatment with a glass etching solution and then to a desmear treatment with an oxidizing agent solution. By such a process, etch back phenomenon and excessive protrusion of glass cloth from the wall surface of a via hole can be sufficiently suppressed, and a highly reliable via can be formed. Particularly, a highly reliable via can be formed in a small via hole having a top diameter of 75 μm or below.

10 Claims, 5 Drawing Sheets